United States Patent [19]
Schrader et al.

[11] Patent Number: 5,621,341

[45] Date of Patent: *Apr. 15, 1997

[54] TEMPERATURE-COMPENSATED, PRECISION FREQUENCY-TO-VOLTAGE CONVERTOR

[75] Inventors: Victor P. Schrader, Palo Alto; Steve Hobrecht, Los Altos, both of Calif.

[73] Assignee: National Semiconductor Corporation, Santa Clara, Calif.

[*] Notice: The term of this patent shall not extend beyond the expiration date of Pat. No. 5,514,988.

[21] Appl. No.: 599,992

[22] Filed: Feb. 14, 1996

Related U.S. Application Data

[63] Continuation of Ser. No. 526,463, Sep. 11, 1995, Pat. No. 5,514,988, which is a continuation of Ser. No. 306,657, Sep. 15, 1994, abandoned.

[51] Int. Cl.$^6$ .................................................. H02M 7/537
[52] U.S. Cl. ........................ 327/102; 327/100; 327/513; 327/362
[58] Field of Search ....................... 327/100, 102, 327/138, 147, 156, 262, 512, 513, 244, 248, 362, 509

[56] References Cited

U.S. PATENT DOCUMENTS

| | | | |
|---|---|---|---|
| 3,614,634 | 10/1971 | Plano et al. | 327/102 |
| 4,225,796 | 9/1980 | Makino et al. | 327/102 |
| 4,547,902 | 10/1985 | Kovitz | 455/194.2 |

*Primary Examiner*—Timothy P. Callahan
*Assistant Examiner*—Dinh T. Le
*Attorney, Agent, or Firm*—Limbach & Limbach LLP

[57] ABSTRACT

A Frequency-to-Voltage Convertor (FVC) circuit is based on a precision one-shot that is compensated in a way such that matching of transistors in the circuit is unimportant. Therefore, temperature spacial gradients are rejected. The necessary saturation voltages for the FVC's npn devices are compensated by modulating the drive level of these devices with temperature.

5 Claims, 6 Drawing Sheets

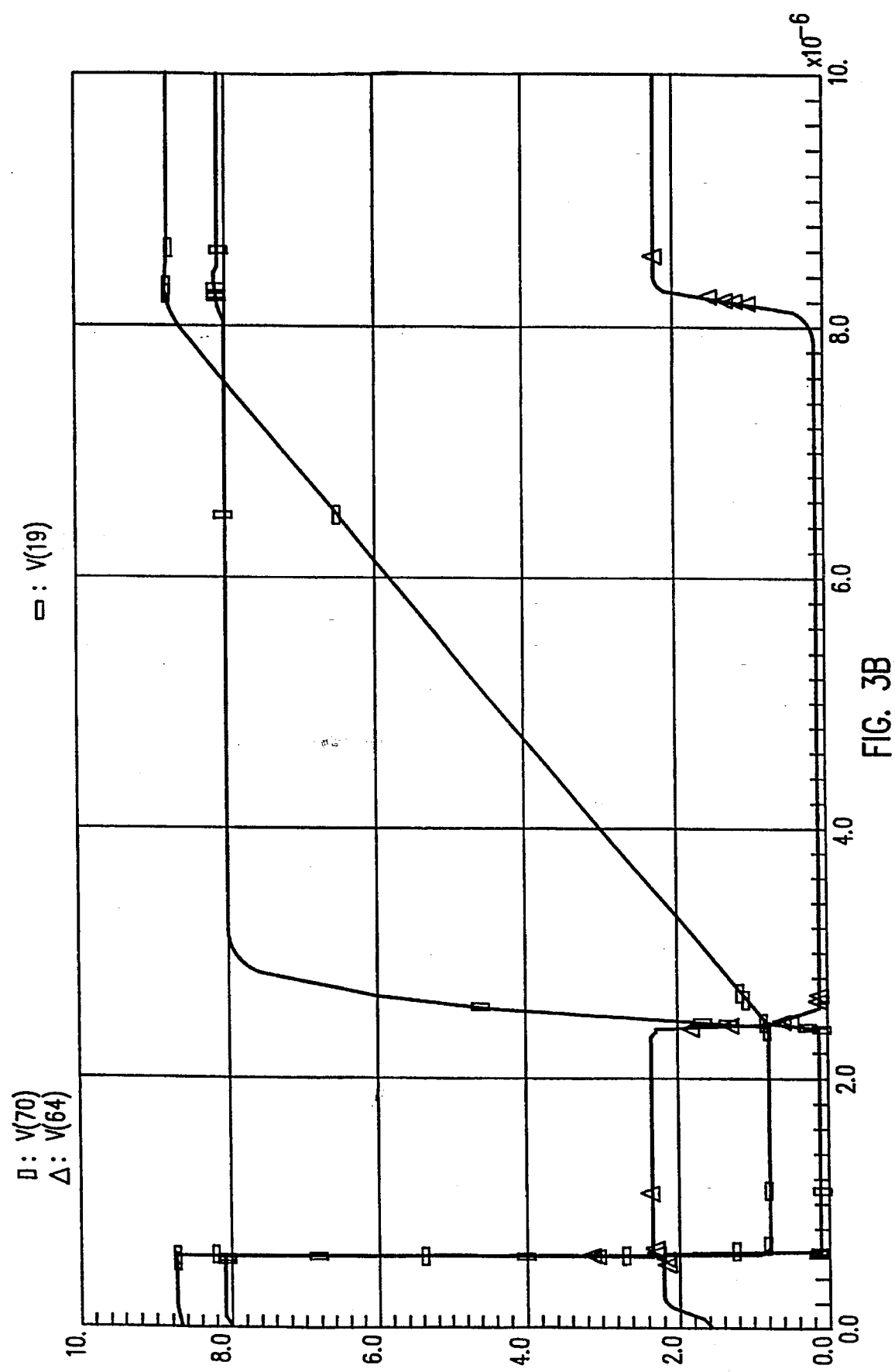

TEMPERATURE-COMPENSATED, PRECISION FREQUENCY-TO-VOLTAGE CONVERTOR

This is a request for filing a continuation application under 37 CFR 1.60, of prior application Ser. No. 08/526,463 filed on Sep. 11, 1995 now U.S. Pat. No. 5,514,988 of VICTOR P. SCHRADER ET AL. for TEMPERATURE-COMPENSATED, PRECISION FREQUENCY-TO-VOLTAGE CONVERTER, which is a continuation of application Ser. No. 08/306,657, filed Sep. 15, 1994 now abandoned.

BACKGROUND OF THE INVENTION

1. Field of the Invention

The present invention relates to Frequency-to-Voltage Convertors (FVC) and, in particular, to a Frequency-to-Voltage Convertor based upon a precision, positive-edge-triggered, amplitude-controlled single-shot having a linear frequency-to-voltage transfer characteristic and that is designed for use in video monitor sync-processing and deflection systems.

2. Discussion of the Prior Art

FIG. 1 shows the general architecture of a phase locked loop (PLL) 10 utilizable in a video monitor sync-processing and deflection system for generating a timing signal OUT that is locked to the frequency of an incoming signal IN. PLL 10 includes a Frequency-to-Voltage Convertor (FVC) 12 that generates an output voltage $V_{FVC}$ that corresponds to the frequency of the input signal IN. The output voltage $V_{FVC}$ is provided to a summer 14 the output $V_{SUM}$ of which controls the output frequency of a voltage controlled oscillator (VCO) 16.

FIG. 1 shows the input signal IN also provided to a phase detector 18 which generates a phase error output $V_E$ that depends upon the phase difference between the input signal IN and the output signal OUT of the VCO 16. If the phase detector 18 is enabled, then its output $V_E$, filtered by filter 20, is also provided to summer 14 to provide a desired positive or negative correction factor to the output $V_{FVC}$ of the FVC 12 depending, respectively, upon whether the input signal IN lags or leads the output signal OUT. If the phase detector 18 is disabled then the VCO 16 is driven directly by the output $V_{FVC}$ of the FVC 12.

One class of FVC utilizable in the FIG. 1 circuit 10 relies on a single-shot that, for each cycle of the input signal IN, generates a pulse of constant duration. Thus, at low input frequencies, the pulses of the FVC output signal $V_{FVC}$ are sparse; conversely, when the frequency of the input signal is high, the FVC produces a crowded pulsed output signal $V_{FVC}$. If the output of this single-shot class of FVC is filtered such that the lowpass filter −3dB frequency is much lower than the lowest frequency of interest in the operation of the FVC, then the resultant DC signal provided to the VCO can be shown to be proportional to the input signal frequency.

However, a single-shot class FVC requires a timing circuit that provides very consistent pulse widths. This consistency is very difficult to achieve because of the matching, temperature compensation and base drive requirements of the bipolar devices typically utilized in such circuits.

SUMMARY OF THE INVENTION

The present invention provides a Frequency-to-Voltage Convertor (FVC) based on a precision one-shot that is compensated such that matching of devices in the FVC circuit is unimportant; therefore, temperature spacial gradients are rejected. Necessary saturation voltages for the circuit's npn devices are compensated by modulating the drive level with temperature.

A better understanding of the features and advantages of the present invention may be obtained by reference to the following detailed description and the accompanying drawing which set forth an illustrative embodiment in which the principles of the invention are utilized.

DESCRIPTION OF THE DRAWINGS

FIGS. 3A–3C are simulation diagrams illustrating the waveforms of the signals at six nodes identified in the FIG. 2 circuit.

DETAILED DESCRIPTION OF THE INVENTION

Figure 1:
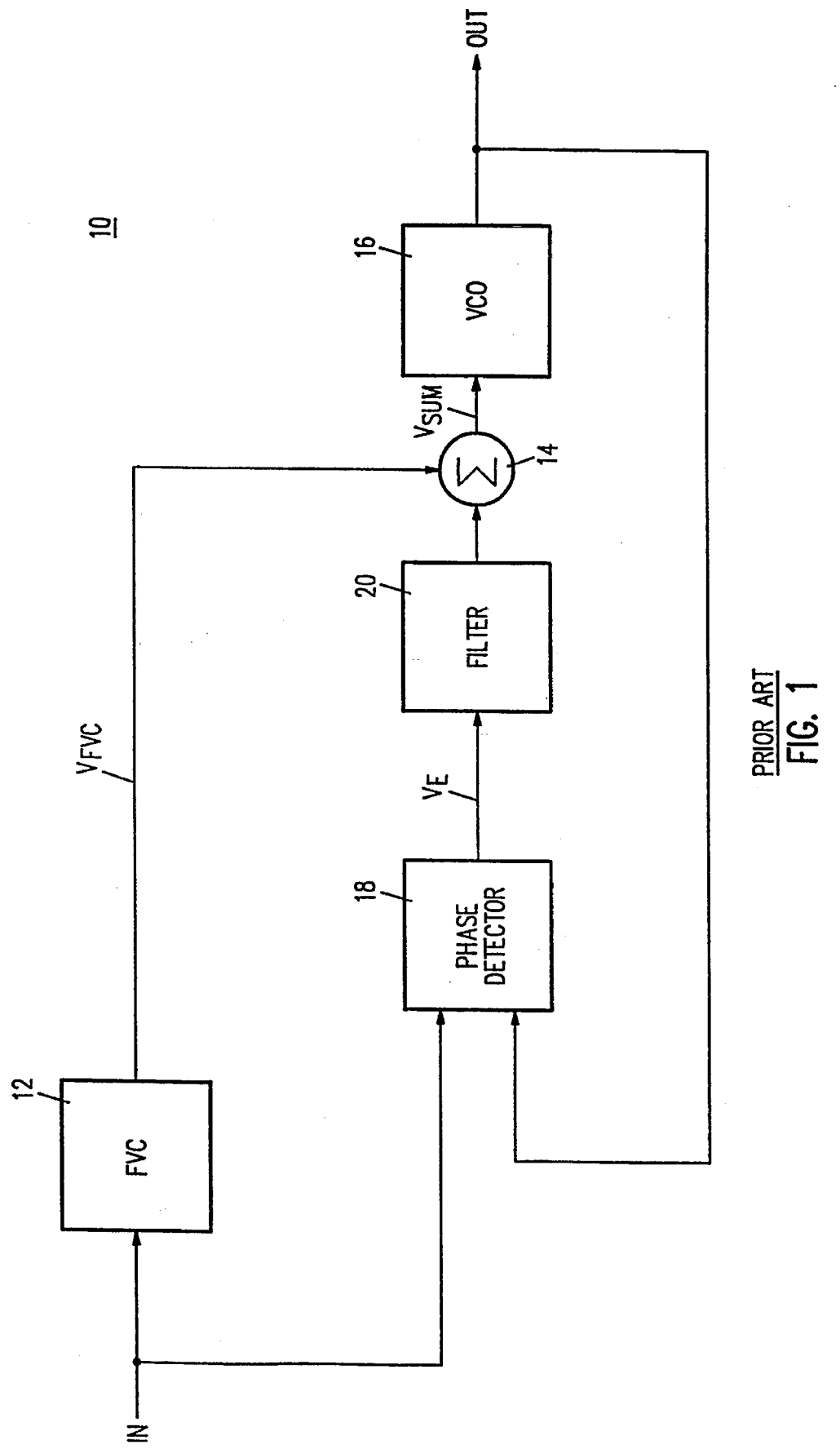
FIG. 1 is a block diagram illustrating a conventional phase locked loop utilizable in video monitor sync-processing and deflection systems.
Figure 2A:
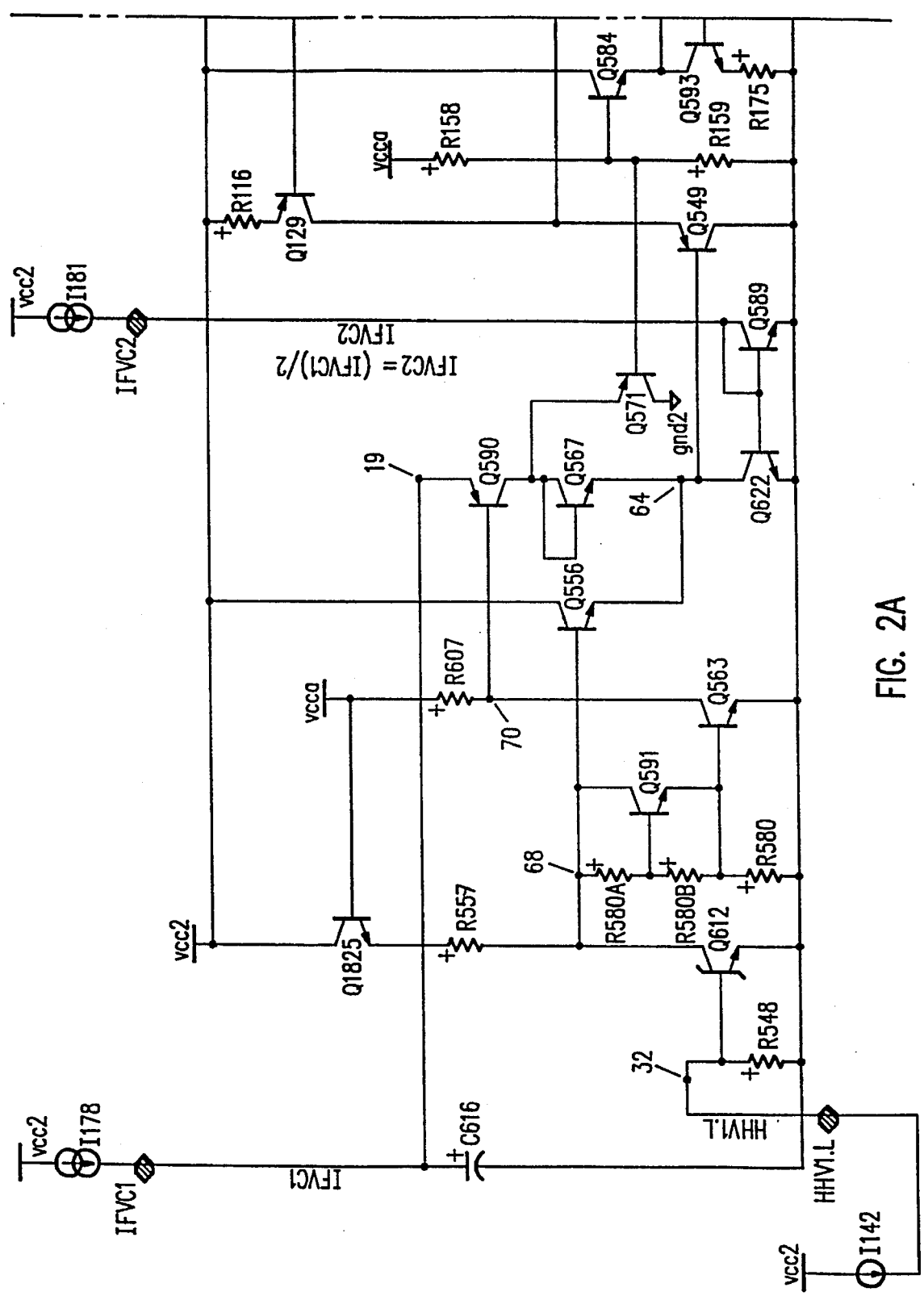
FIG. 2 is a detailed schematic diagram illustrating a circuit embodiment of a Frequency-to-Voltage Convertor (FVC) in accordance with the present invention.
Figure 2B:
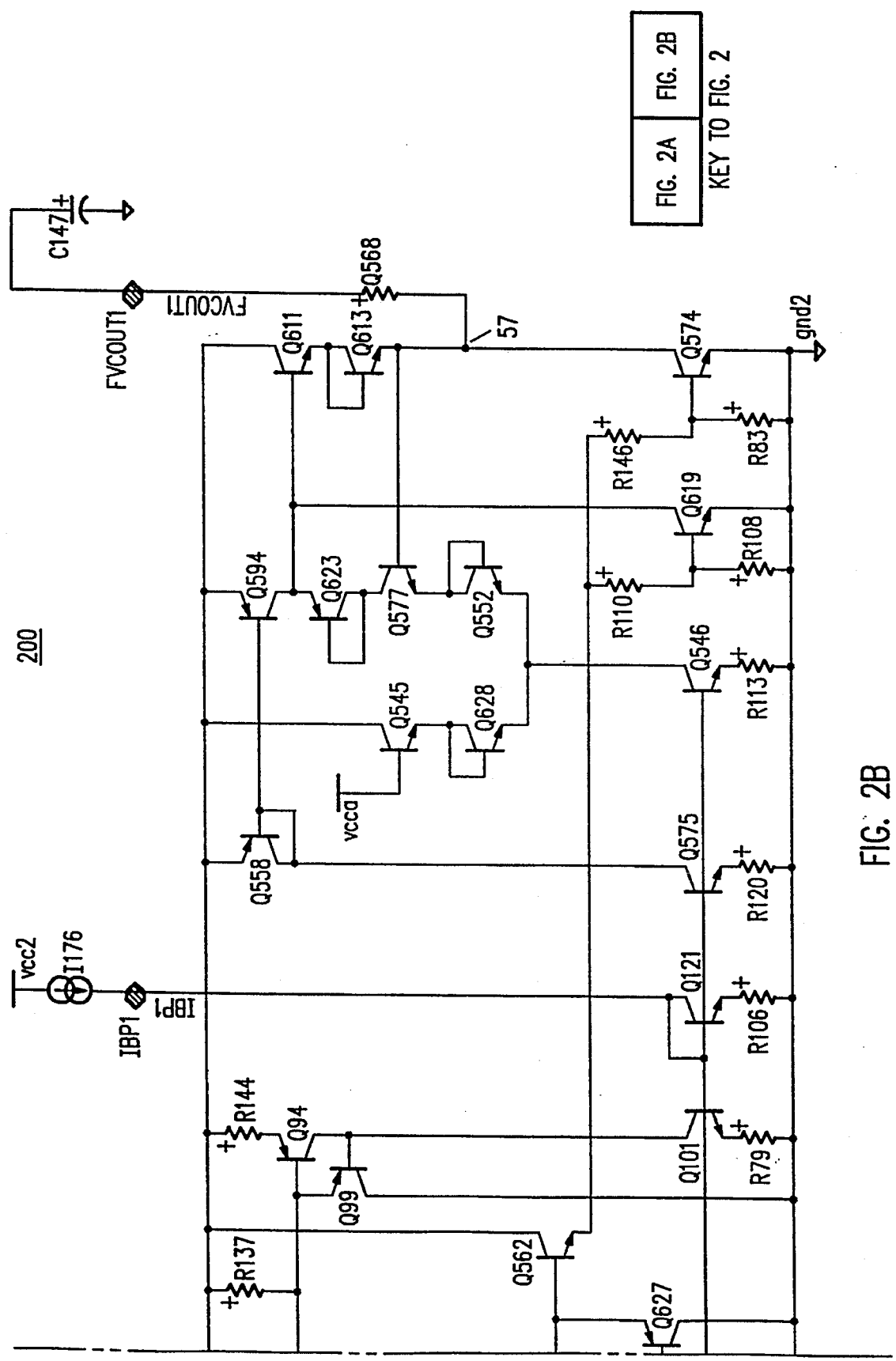

FIG. 2 shows a Frequency-to-Voltage Convertor (FVC) circuit 200 that can be divided into two sections. The triggering and timing of the single-shot are performed in the left hand section of the circuit 200 beginning with the timing capacitor C616. The amplitude of the pulse is set by the right section of the circuit 200, beginning with emitter coupled pair Q545, Q577.

Starting at the input of the circuit 200, note that input HHV1.L is a current mode signal. The required signal is a negative-going pulse train having nominal 100 uA amplitude (source-only), a duty cycle of between 5% and 20% and frequency between 10–150 kHz. When input signal HHV1.L is off (during a pulse), the collector voltage of npn device 612 equals 4*Vbe due to voltage division by resistors R580A and R580B and the Vbe of device Q583. Between sync pulses, device Q612 is on and its collector voltage equals ~0.3 V. Thus, the signal on the collector of device Q612 is a positive-going sync pulse. Between sync pulses, input signal HHV1.L is sourcing current. Therefore, as stated above, device Q612 is on and its collector voltage equals ~0.3 V. Since npn device Q563 is off, the base drive voltage of pnp device Q590 is 8 V. Current IFVC1 charges capacitor C616 until device Q590 turns on at about 8.7 V; then the emitter current of device Q590 equals IFVC1. Since IFVC1=2*IFVC2, npn device Q622 can only sink half of the collector current of device Q590. Therefore, the collector current of device Q567 equals IFVC2. The collector of device Q622 rises until device Q571 turns on. Thus, the collector voltage of device Q590 equals 2.2 V+Vbe. Current IFVC1 is split equally between transistors Q567 and Q571. The base current of transistor Q590 must flow through resistor R607 to reference voltage supply Vcca; the base voltage of device Q590 actually rises above 8 V during this interval.

At the start of a horizontal sync pulse, input signal HHV1.L stops sourcing current and the collector of device Q612 goes from quasi-saturation to 4*Vbe. Device Q563 is turned on and, in fact, goes into saturation very quickly, discharging capacitor C616 through the base of device Q590, which remains saturated during and after the discharge of capacitor C616.

At the same time, transistors Q556 and Q591 turn on, pulling the collector voltage of device Q622 to 3 Vbe. Current IFVC1 then flows out of the base of transistor Q590, which is still saturated, and into the saturated collector of transistor Q563. Thus, the voltage of capacitor C616 quickly moves from 8.7 V to 0.7 V and remains at that level during the sync pulse.

Note that until this time in the operation of the circuit 200, the collector voltage of device Q622 has been at about 3 Vbe: before the sync pulse, it equalled ~2.2 V, and during the sync pulse it equalled 3 Vbe. As discussed below, this node goes to ground (sat) momentarily after the sync pulse ends; this is the information that allows production of a single-shot output pulse.

At the trailing edge of the horizontal sync pulse, input signal HHV1.L starts sourcing current once again. The collector voltage of device Q622 returns to 0.3 V and device Q563 turns off so that the base voltage of device Q590 immediately rises to 8 V. Device Q590 turns off and current IFVC1 begins charging capacitor C616 from 0.7 V. Since the collector of device Q612 is low, the collector of device Q622 is no longer being held up by device Q556; since no current is entering the Q622 collector node, the collector voltage of device Q622 equals Vce_sat. This represents the START of the output pulse.

When the capacitor C616 has charged to ~8.7 V, device Q590 turns on and the collector current of device Q590 equals IFVC1. Since IFVC1=2*IFVC2, current IFVC1 quickly dominates and pulls the collector voltage of device Q622 up until clamp device Q571 turns on and the collector voltage of device Q622 equals ~2.2 V. This represents the END of the output pulse.

Thus, the signal at the collector of device Q622 is a waveform which rests at 2.2 V between sync pulses, equals 2 Vbe during sync, and equals Vce_sat from just after the trailing edge of sync until the capacitor C616 is fully charged, when it returns to 2.2 V at the next sync pulse. This signal then is applied to a vertical pnp emitter follower Q549, a 2.2 V clamp (devices Q584, Q627) and an npn emitter follower Q562. At the emitter of device Q562, the signal is now a cleaned up, negative-going pulse that rests at 2.2 V−Vbe before and during sync. The (Vce_sat) pulse starts just after the sync trailing edge and ends when the capacitor C616 has charged.

The 8 V voltage clamp includes the npn emitter coupled pair Q545 and Q577. In its resting state (between output pulses), the base voltage of device Q611 equals Vce_sat and, at the output pulse node, the collector voltage of device Q574 equals Vce_sat. During an output pulse, npn devices Q619 and Q574 are off. The feedback amplifier (which comprises the devices to the right of device Q575 in FIG. 2, except devices Q619 and Q574 and associated resistors) is active and keeps the output node at the collector of device Q574 equal to 8 V, where the 8 V input to device Q545 is provided by a bandgap reference external to the circuit 200 under consideration.

Experiments with an integrated circuit realization, as well as simulation, of the, above-described FVC 200 have shown its temperature coefficient to be less than 20 ppm/degrees Celsius over the temperature range 0–85 degrees C. The design techniques utilized to achieve this performance are described below. Note that the die layout for the above-described circuit 200 uses no cross-coupling, common-centroid or other rigorous device matching methods.

The most important and fundamental technique is the use of a single transistor, pnp Q590, which sets both of the pulse-time-controlling integration thresholds. The Vbe of device Q590 is added to both the thresholds, rendering device matching considerations irrelevant. During the integration, transistor Q590 is off, and there are no transistor bases attached to the integration node; thus, changes in beta do not affect the integration.

One-shot FVCs typically exhibit nonlinearity resulting from reduced pulsewidth at higher frequencies. This is due to incomplete resetting of the capacitor voltage between pulses. In accordance with the invention, the 18 pF capacitor C616 discharges through the base of lateral pnp Q590 and the collector of npn Q563. The naturally low base resistance of the lateral pnp Q590, and conventional layout measures taken for low npn collector resistance, result in a discharge RC time constant no longer than 20 ns. Since the shortest available discharge time is 500 ns, the capacitor C616 is always discharged to a level corresponding to at least 25 time constants—an error of 14E-12, or 14 ppt (parts per trillion).

The saturation voltages of transistors Q563 and Q574 are crucial in assuring low drift. Note that these two saturation voltages cancel first order, since a nonzero saturation voltage produces, for transistor Q563, a narrowed output pulse resulting m lowered DC output, and, for transistor Q574, a higher DC output. Using empirical data for saturation voltage versus temperature, current, and forced beta, the base drive for both these devices (Q563, Q574) is designed to have a strong positive temperature coefficient. For example, the base drive current for transistor Q563 is set by the current of resistor 20 k R557. The voltage across resistor R557, when transistor Q563 is on, is 8 V−5 Vbe. Similarly, the base drive current in transistor Q574 is set by 1.7 k resistor R146, the voltage across which is 2.2 V−2 Vbe.

Figure 3A:
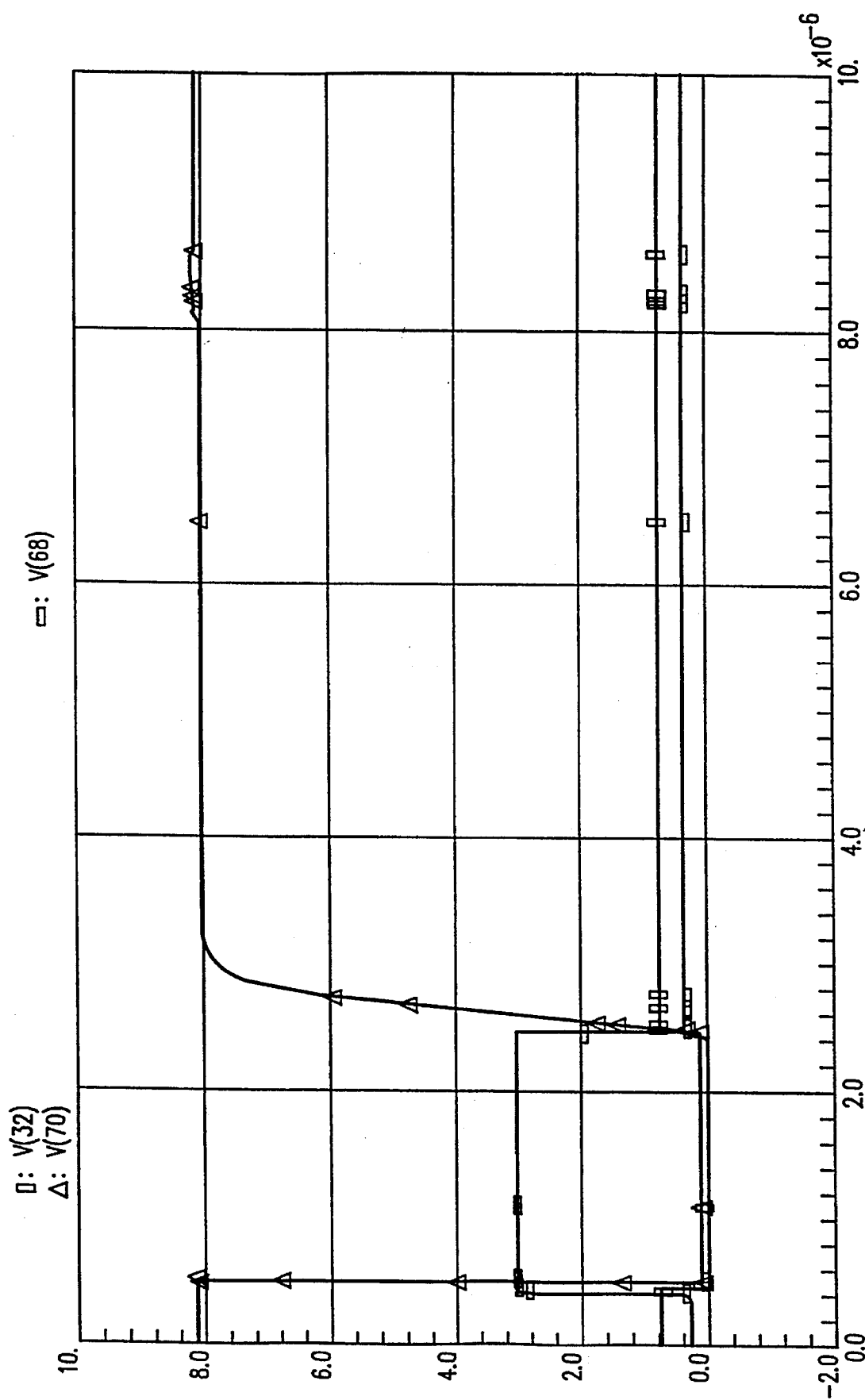
Figure 3C:
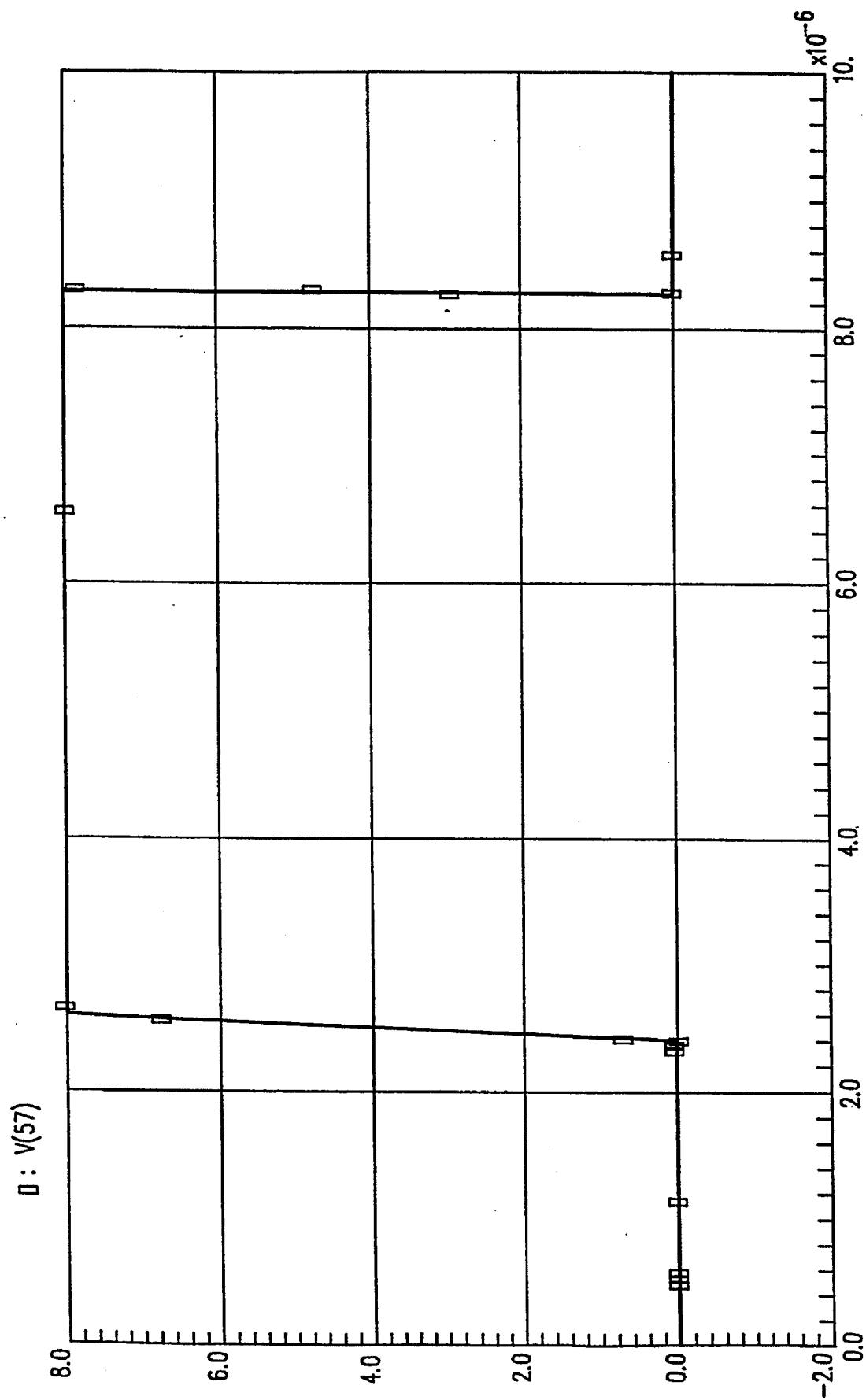

The simulation waveforms of the signals at nodes 19, 32, 57, 64, 68 and 70 of the FIG. 2 circuit 200 are shown in the FIG. 3A–FIG. 3C diagrams to further illustrate the operation of the FIG. 2 circuit 200.

It should be understood that various alternatives to the embodiments of the invention described herein may be employed in practicing the invention. For example, those skilled in the an will appreciate that the polarity of the FIG. 2 circuit 200 may be reversed while still achieving the desired results. It is intended that the following claims define the scope of the invention and that structures and methods within the scope of the claims and their equivalents be covered thereby.

What is claimed is:

1. A temperature-compensated, precision frequency-to-voltage converter circuit that, for each cycle of an input signal to the converter circuit, provides a voltage output pulse of constant duration at an output, the circuit comprising:

a first current source that provides a first output current;

a timing capacitor having a first plate connected to receive the first output current and a second plate connected to a negative power supply;

a voltage source that provides a reference voltage;

a first pnp transistor having its emitter couple to receive the first output current and its base coupled to receive the reference voltage;

a second current source that provides a second output current;

a second pnp transistor having its emitter coupled to an output control circuitry, its collector connected to the negative power supply and its base coupled to the collector of the first pnp transistor;

a first npn transistor having its collector connected to a positive power supply and its emitter connected between the collector of the first pnp transistor and the base of the second pnp transistor;

a second npn transistor having its collector coupled to receive the reference voltage and its emitter connected to the negative power supply;

base drive circuitry that responds to a pulsed, current mode input signal by providing a first temperature-compensated base drive signal to the base of the first npn transistor and a second temperature-compensated base drive signal to the base of the second npn transistor; and wherein the output control circuitry that responds to a control voltage signal provided at the emitter of the second pnp transistor by providing a temperature-controlled voltage output pulse having a controlled pulse height at said output.

2. A temperature-compensated, precision frequency-to-voltage converter circuit as in claim 1 and further comprising a diode connected between the collector of the first pnp transistor and the base of the second pnp transistor.

3. A temperature-compensated, precision frequency-to-voltage converter circuit as in claim 2 and further comprising a third current source connected between the emitter of the first npn transistor and the negative power supply.

4. A temperature-compensated, precision frequency-to-voltage converter circuit as in claim 3 and further comprising a resistor connected between the reference voltage and the base of the first pnp transistor.

5. A temperature-compensated, precision frequency-to-voltage converter circuit as in claim 2 and wherein said diode is a transistor-connected diode.

\* \* \* \* \*

UNITED STATES PATENT AND TRADEMARK OFFICE
CERTIFICATE OF CORRECTION

PATENT NO.  : 5,621,341
DATED       : April 15, 1997
INVENTOR(S) : Victor P. Schrader, et al It is certified that error appears in the above-indentified patent and that said Letters Patent is hereby corrected as shown below:

Column 4, line 58, delete "couple" and replace with --coupled--.

Signed and Sealed this

Nineteenth Day of August, 1997

*Attest:*

BRUCE LEHMAN

*Attesting Officer*      *Commissioner of Patents and Trademarks*